United States Patent
Thompson et al.

(10) Patent No.: US 9,723,113 B2
(45) Date of Patent: *Aug. 1, 2017

(54) PROTECTIVE COVER FOR ELECTRONIC DEVICE WITH SURFACE FOR ATTACHING BUILDING ELEMENTS

(71) Applicant: RUBICON COMMUNICATIONS, LP, Austin, TX (US)

(72) Inventors: Hunter S. Thompson, Austin, TX (US); James W. Thompson, Austin, TX (US); Jamie Thompson, Austin, TX (US); Frazier Newlin, Austin, TX (US)

(73) Assignee: Pono Paani, LLC, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/050,493

(22) Filed: Oct. 10, 2013

(65) Prior Publication Data
US 2015/0105127 A1    Apr. 16, 2015

(51) Int. Cl.
| | |
|---|---|
| *H04M 1/02* | (2006.01) |
| *G06F 1/16* | (2006.01) |
| *H05K 5/03* | (2006.01) |
| *A63H 33/10* | (2006.01) |
| *H04B 1/3888* | (2015.01) |
| *A45C 15/00* | (2006.01) |
| *A45C 11/00* | (2006.01) |
| *A45C 13/02* | (2006.01) |

(52) U.S. Cl.
CPC .......... *H04M 1/0202* (2013.01); *A45C 11/00* (2013.01); *A45C 15/00* (2013.01); *A63H 33/101* (2013.01); *G06F 1/1628* (2013.01); *G06F 1/1633* (2013.01); *H04B 1/3888* (2013.01); *H04M 1/0283* (2013.01); *H05K 5/03* (2013.01); *A45C 2011/003* (2013.01); *A45C 2013/025* (2013.01)

(58) Field of Classification Search
CPC ....................................................... H05K 5/03
USPC ....................................................... 455/575.8
See application file for complete search history.

(56) References Cited

U.S. PATENT DOCUMENTS

| | | |
|---|---|---|
| 260,568 A | 7/1882 | Hayden |
| 525,986 A | 9/1894 | Krutsch |
| 528,126 A | 10/1894 | Horton |

(Continued)

FOREIGN PATENT DOCUMENTS

| | | |
|---|---|---|
| JP | 2004129704 A | 4/2004 |
| WO | 9936136 A1 | 7/1999 |
| WO | 2013043465 | 3/2013 |

OTHER PUBLICATIONS

Smallworks brick case, Jun. 15, 2012.*

(Continued)

*Primary Examiner* — Muthuswamy Manoharan
(74) *Attorney, Agent, or Firm* — Meyertons, Hood, Kivlin, Kowert & Goetzel, P.C.

(57) ABSTRACT

A protective cover for a handheld portable electronic device includes a front cover, and one or more mounting portions. The mounting portions can couple the front cover to the handheld portable electronic device. The front cover can cover the display screen of the portable electronic device. The front cover, the mounting portions, or both include studded surfaces or socket surfaces. The studded surfaces or socket surfaces couple with standard building elements of a play building set.

13 Claims, 12 Drawing Sheets

(56) References Cited

U.S. PATENT DOCUMENTS

| | | | |
|---|---|---|---|
| 539,539 | A | 5/1895 | Palmer et al. |
| 540,539 | A | 6/1895 | Conness |
| 570,593 | A | 11/1896 | Bray |
| 603,838 | A | 5/1898 | Davis et al. |
| 614,603 | A | 11/1898 | Baumgartner |
| 644,633 | A | 3/1900 | Penticoff |
| 647,526 | A | 4/1900 | Runyan |
| 654,900 | A | 7/1900 | Knadler |
| 656,929 | A | 8/1900 | Blake |
| 658,373 | A | 9/1900 | Hull |
| 666,417 | A | 1/1901 | Gillet |
| 668,246 | A | 2/1901 | Wurts |
| 669,458 | A | 3/1901 | Fisher et al. |
| 671,933 | A | 4/1901 | Milne et al. |
| 673,159 | A | 4/1901 | Dickson et al. |
| 674,798 | A | 5/1901 | Smith et al. |
| 694,222 | A | 2/1902 | Wertenbruch |
| 3,005,282 | A | 10/1961 | Christiansen |
| D244,632 | S | 6/1977 | Christiansen |
| D260,568 | S | 9/1981 | Cherry |
| 4,872,410 | A | 10/1989 | Lilly |
| 4,926,758 | A | 5/1990 | Lilly et al. |
| 5,046,739 | A | 9/1991 | Reichow |
| D338,053 | S | 8/1993 | Underhill et al. |
| 5,250,000 | A | 10/1993 | Boutin et al. |
| 5,476,261 | A | 12/1995 | Hultstrand |
| 5,645,277 | A | 7/1997 | Cheng |
| 5,976,018 | A | 11/1999 | Druckman |
| 6,193,609 | B1 | 2/2001 | D'Achard Van Enschut |
| 6,241,247 | B1 | 6/2001 | Sternberg et al. |
| 6,443,796 | B1 | 9/2002 | Shackelford |
| 6,710,766 | B1 | 3/2004 | Ogata |
| D525,986 | S | 8/2006 | Kim |
| D528,126 | S | 9/2006 | Kim |
| D539,539 | S | 4/2007 | Braden |
| D540,539 | S | 4/2007 | Gutierrez |
| D570,593 | S | 6/2008 | Justiss |
| 7,586,032 | B2 | 9/2009 | Louis |
| D603,838 | S | 11/2009 | Willis |
| D614,603 | S | 4/2010 | Skillings |
| 7,731,191 | B2 | 6/2010 | Sternberg |
| 7,938,260 | B2 | 5/2011 | Lin |
| D644,633 | S | 9/2011 | Chiu |
| D647,526 | S | 10/2011 | Vandiver et al. |
| 8,091,892 | B2 | 1/2012 | Sternberg |
| D654,900 | S | 2/2012 | Jung |
| D656,929 | S | 4/2012 | Hsiung |
| D658,373 | S | 5/2012 | Gros |
| D666,417 | S | 9/2012 | Phillips et al. |
| D668,246 | S | 10/2012 | Fathollahi |
| D669,458 | S | 10/2012 | Wilson et al. |
| D671,933 | S | 12/2012 | Rodgers |
| D673,159 | S | 12/2012 | McCarthy et al. |
| D674,798 | S | 1/2013 | Kim et al. |
| 8,477,931 | B2 | 7/2013 | Thompson et al. |
| D694,222 | S | 11/2013 | Thompson et al. |
| D694,226 | S | 11/2013 | Thompson et al. |
| 9,044,689 | B2 | 6/2015 | Thompson et al. |
| 2002/0195771 | A1 | 12/2002 | Ku |
| 2002/0196250 | A1 | 12/2002 | Anderson et al. |
| 2003/0082986 | A1 | 5/2003 | Wiens et al. |
| 2003/0109314 | A1 | 6/2003 | Ku |
| 2004/0092207 | A1 | 5/2004 | Hansen |
| 2009/0101766 | A1 | 4/2009 | Kalis et al. |
| 2009/0111543 | A1* | 4/2009 | Tai et al. ............... 455/575.8 |
| 2011/0049005 | A1 | 3/2011 | Wilson et al. |
| 2011/0064401 | A1 | 3/2011 | Desorbo |
| 2012/0217257 | A1* | 8/2012 | Ting ............... 220/660 |
| 2012/0261289 | A1 | 10/2012 | Wyner et al. |
| 2012/0274195 | A1 | 11/2012 | Thompson et al. |
| 2012/0325838 | A1 | 12/2012 | Huang |
| 2013/0313142 | A1* | 11/2013 | Wen ............... A45C 11/00 206/320 |

OTHER PUBLICATIONS

Birming, "LEGO star wars for Nintendo DS", Oct. 4, 2009, [WWW.geekalerts.com/lego-star-wars-casenintendo-ds].*
Nathan Sawaya, Iphone—The Art of Brick, http://brickartisl.com/gallery/iphone/?tag=technology, Sep. 2007 downloaded Aug. 2, 2013. pp. 1-6.
"Lego Electronics" downloaded Aug. 2, 2013 via Wayback Machine Oct. 28, 2010 from digiblue.com/products/lego/, pp. 1-2.
Jerry Hildenbrand "Android gives eyes, ears, and a sense of direction to a Lego NXT robot" published Jul. 9, 2010 downloaded from www.androidcentral.com/android-gives-eyes-ears-and-sense-direction-lego-nxt-robot, pp. 1-2.
Al Hilal "Digital Blue's LEGO MP3 Player" published Apr. 18, 2009, trendygadget.com, pp. 1-9.
"Lego iPad Stand" discussion posted Aug. 24, 2010 on www.ifans.com/forums/threads/lego-ipad-stand.307442/page-3 , pp. 1-5.
"Amazon iPod Building Block Portable Speaker Dock" Amazon product page downloaded Mar. 28, 2011 from www.amazon.comliPod-Building-Biock-Portable-Speaker/dp/B001KYV75W/ . . . , pp. 1-4.
"Amazon Lego 2GB MP3 Player" Amazon product page downloaded Mar. 28, 2011 from www.amazon.com/Digital-Blue-LG 14000-LEGO-Piayer/dp/B002L619ZE/ . . . , pp. 1-5.
Roland Hutchinson "Fun Gadgets—The Lego Phone", published Mar. 21, 2008, www.geeky-gadgets.com/fun-gadgets-the-lego-phone/, pp. 1-4.
Jerry M. Hatfield, John T. Tester "Lego Plus", Proceedings of the 2005 American Society for Engineering Education Annual Conference & Exposition, pp. 1-5.
Todd Ripplinger "The 'Legobox'" Published Jan. 8, 2002, mini-itx.com/projects/legobox/, pp. 1-5.
"Lego Xbox Case" discussion posted Feb. 21-Mar. 2, 2005, forums.xbox-scene.com/ .. ./t360699, pp. 1-8.
David R. Van Wagner "On Screen Programming version 1.0 for Lego Mindstorms" Copyright 1999, downloaded Mar. 26, 2011 from alumni.cse.ucsc.edu/-davevw/onscreen/, pp. 1-4.
Timothy S. McNerney "From turtles to Tangible Programming Bricks: explorations in physical language design" Published Jul. 29, 2004 pp. 1-12.
"DIY Lego Case Mod PC" Published Aug. 9, 2008 downloaded from zedomax.com/blog/ .. ./diy-lego-case-mod-pc pp. 1-3.
Nathan Sawaya, BlackBerry Tour 9630 Artistic in Lego, http:f/www.phonesreview.co.uk/201     0/03/14/blackberry-tour-9630-artisticin-lego/, Mar. 14, 2010. pp. 1-3.
Nathan Sawaya, PC MAG Computer—The Art of Brick, http:l/brickartist.com/gallery/pc-magazine-computer/?tag=technology, Feb. 2006. pp. 1-4.
U.S. Appl. No. 13/098,106, filed Apr. 29, 2011, Hunter S Thompson et al.
U.S. Appl. No. 29/390,894, filed Apr. 29, 2011, Hunter S. Thompson.
U.S. Appl. No. 13/927,911, filed Jun. 26, 2013, Hunter S. Thompson.
Office Action from U.S. Appl. No. 13/098,106, issued Nov. 6, 2012, pp. 1-11.
Office Action from U.S. Appl. No. 13/927,911, issued Jun. 5, 2014, pp. 1-5.
European Search Report from Application No. 14188209.2, issued Feb. 24, 2015.
Notice of Allowance in U.S. Appl. No. 13/098,106, mailed May 28, 2013.
Notice of Allowance in U.S. Appl. No. 13/098,106, mailed Apr. 1, 2013.
Notice of Allowance in U.S. Appl. No. 13/927,911, mailed Jan. 28, 2015.
Birming, "LEGO Star Wars Case for Nintendo DS", Oct. 5, 2009. [www.geekalerts.com/lego-star-wars-case-nintendo-ds/].
Poulter, "Bricks ain't what they used to be as LEGO 'develops mobile phone'", Feb. 13, 2009. [www.dailymail.co. uk/sciencetech/article-1144     714/Bricks-aint-used-Lego-develops-mobile-phone.html].

(56) References Cited

OTHER PUBLICATIONS

"19 Weird and Wonderful Ways to Hold your iPhone in Place", Oct. 27, 2009. [ismashphone. com/2009/ 10/19- weird-andwonderful-ways-to-hold-your -iphone-in-p lace-iphone-dyi-docks.html].
Office Action, U.S. Appl. No. 90/013,523, mailed Oct. 23, 2015, 15 pages.
Office Action, U.S. Appl. No. 90/013,522, mailed Oct. 23, 2015, 14 pages.
Request for Ex Parte Reexamination, U.S. Pat. No. 8,477,931, filed Apr. 29, 2011, 179 pages.
Order Granting the Request for Ex Parte Reexamination, U.S. Pat. No. 8,477,931, mailed Jul. 2, 2015, 15 pages.
Request for Ex Parte Reexamination (Replacement), U.S. Pat. No. 9,044,689, filed Jun. 26, 2013, 43 pages.
Order Granting the Request for Ex Parte Reexamination, U.S. Pat. No. 9,044,689, mailed Jul. 2, 2015, 19 pages.
Preliminary Statement of Invalidity, Civil Action No. 1:14-cv-1089-SS, filed Jul. 17, 2015, 20 pages.
"Dorian's Lego Computers", May 26, 2011, 3 pages. [www.poseidonguild.com/legos/index.php].
Resnick et al., "Programmable Bricks: Toys to think with", IBM Systems Journal, vol. 35, No. 3&4, Date of current version: Apr. 6, 2010, Issued 1996, 10 pages.
Borovoy et al., "GroupWear: Nametags that Tell about Relationships", MIT Media Laboratory, Apr. 18-23, 1998, 2 pages.
Resnick, "Technologies for Lifelong Kindergarten", MIT Media Laboratory, Dec. 1998, Educational Technology Research & Development, vol. 46, No. 4, 15 pages.
Ex Parte Advisory Action, U.S. Appl. No. 90/013,523, mailed Jul. 20, 2016, 15 pages.
Ex Parte Advisory Action, U.S. Appl. No. 90/013,522, mailed Aug. 11, 2016, 16 pages.
Non-final Office Action, U.S. Appl. No. 14/050,493, mailed Jul. 23, 2015, 21 pages.
Defendant's Invalidity Contentions, Civil Action No. 15-cv-00823-VLB, submitted Nov. 2, 2015, 103 pages.
Office Action from U.S. Appl. No. 14/050,493 mailed Jul. 23, 2015, 21 pages.
Final Office Action from U.S. Appl. No. 14/050,493 mailed Dec. 16, 2015, 20 pages.
Final Office Action, U.S. Appl. No. 90/013,523, mailed Apr. 12, 2016, 16 pages.
Final Office Action, U.S. Appl. No. 90/013,522, mailed Apr. 29, 2016, 20 pages.
Ferrari et al., "Building Robots with LEGO Mindstorms", Front and back cover, preface, foreword, chapter 4, 6, 9, 13, 16, 18, 20-21, 26-28, appendix, and back cover, Dec. 6, 2001, 228 pages, Syngress.
Philohome, "LEGO Mindstorms & LEGO Technic", Web, 20 pages, Dec. 4, 2004 [https://web.archive.org/web/20041204044616/http://www.philohome.com/mindstorms.htm] (accessed Jun. 10, 2016).
Plazaearth, "MindStorms RCX Sensor Input Page", Web, 9 pages, Dec. 4, 2004 [https://web.archive.org/web/20041204111548/http:/www.plazaearth.com/usr/gasperi/lego.htm] (accessed Jun. 10, 2016).
Office Action, U.S. Appl. No. 14/727,110, mailed Apr. 15, 2016, 34 pages.
Final Office Action, U.S. Appl. No. 14/727,110, mailed Jul. 19, 2016, 10 pages.
Notice of Allowance, U.S. Appl. No. 14/727,110, mailed Dec. 6, 2016, 17 pages.
Ex Parte Reexamination Certificate, U.S. Pat. No. 8,477,931, issued Oct. 31, 2016.
Ex Parte Reexamination Certificate, U.S. Pat. No. 9,044,689, issued Oct. 28, 2016.

* cited by examiner

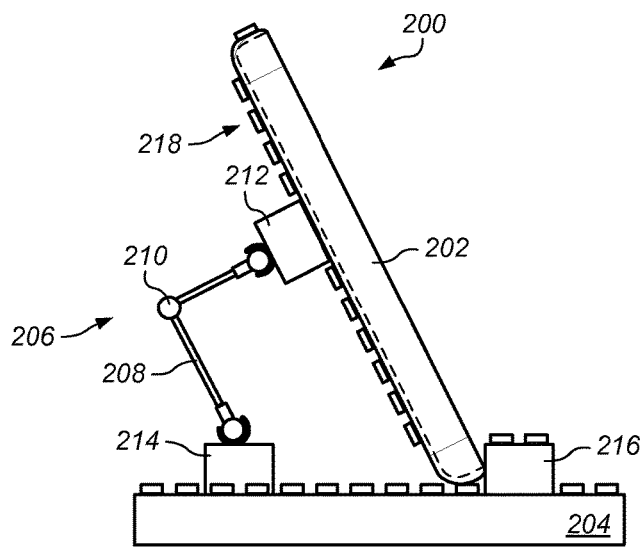
FIG. 6
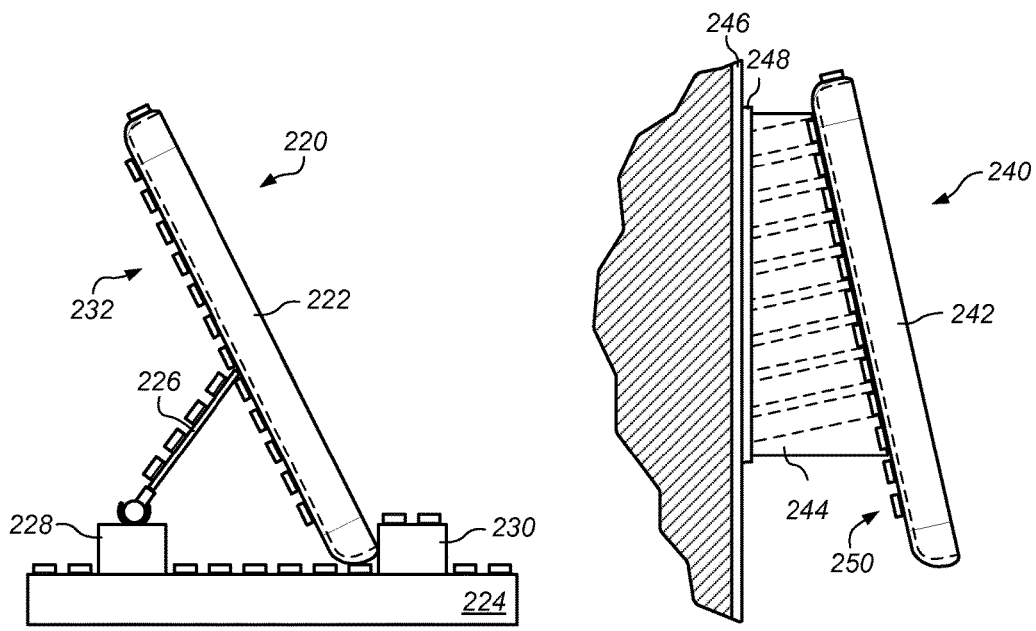
FIG. 7
FIG. 8

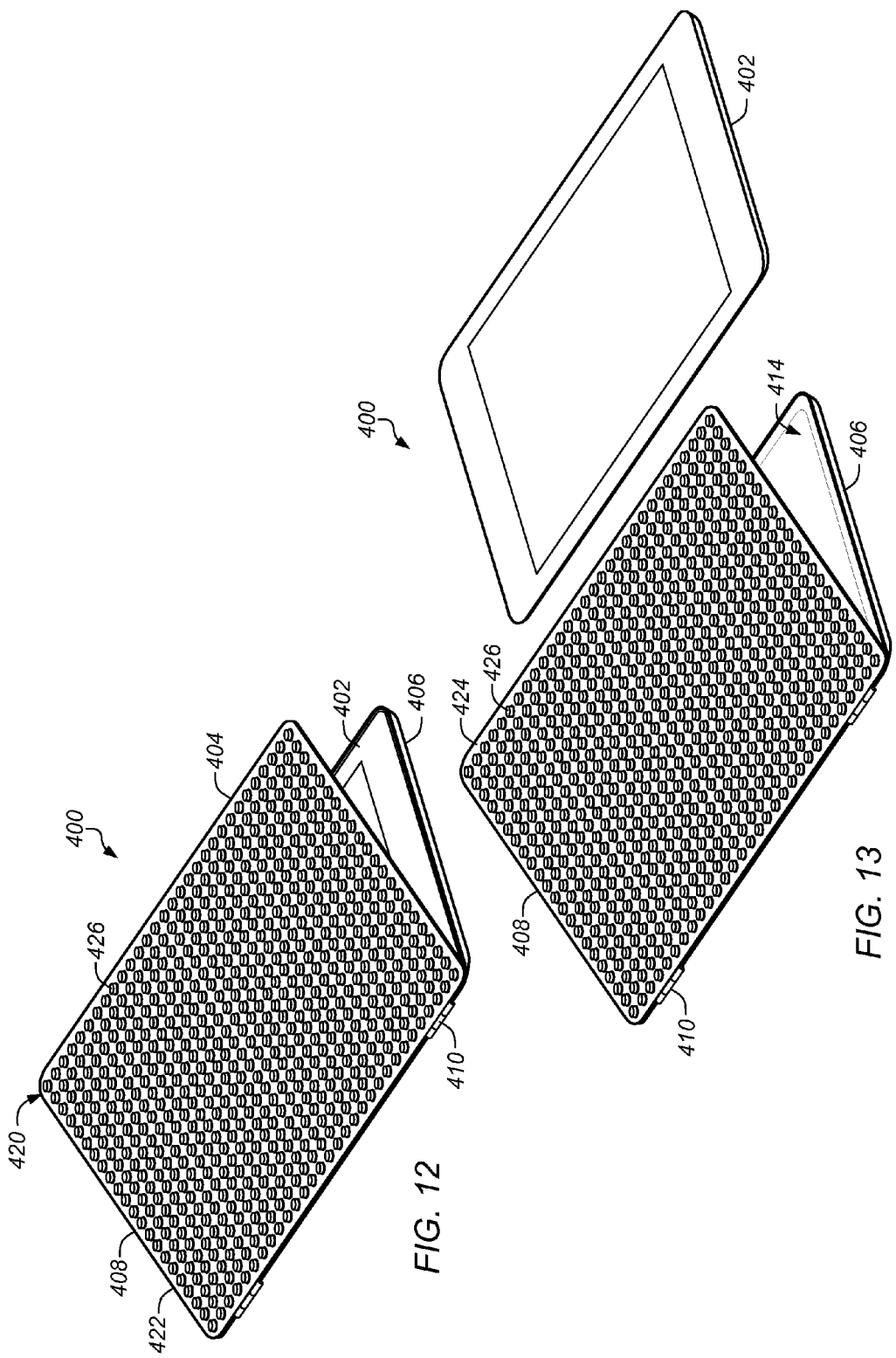

PROTECTIVE COVER FOR ELECTRONIC DEVICE WITH SURFACE FOR ATTACHING BUILDING ELEMENTS

BACKGROUND

Field

The present invention relates generally to protective covers for portable electronic devices. More particularly, the present disclosure relates to protective covers for portable electronic devices that allow for attachment of building elements.

Description of the Related Art

Portable electronic devices, such as smart phones, portable media players, and personal digital assistants, have been growing in popularity. Typically, a portable electronic device includes a housing to contain the electronics for the device, a front panel with a display screen, and one or more connector ports for cable connections with external computer systems and chargers.

Portable electronic devices may be used in variety of indoor and outdoor environments. In these environments, the devices may encounter external loads (such as a shock loads or vibration) and exposure to foreign materials (such as dust, debris, or liquids). In some circumstances, excessive loads or contamination cause a portable electronic device to malfunction.

Portable electronic devices usually operate on internal batteries. When the charge on the battery in a device runs low, the device must be connected to an external charging system. In some cases, a device may run low on charge in a location where the user does not have access to an external charging system (such as in a park or in the passenger section of an airplane). The user thus may be forced to suspend use of the device until the user reaches a location with a charging system.

SUMMARY

Embodiments for a protective cover for a portable electronic device are described herein. In an embodiment, a protective cover for a handheld portable electronic device includes a front cover, and one or more mounting portions. The mounting portions can couple the front cover to the handheld portable electronic device. The front cover can cover the display screen of the portable electronic device. The front cover, the mounting portions, or both include studded surfaces or socket surfaces. The studded surfaces or socket surfaces couple with standard building elements of a play building set. In certain embodiments, the mounting portions hold the front cover in position on the portable electronic device by way of magnetic attachment.

In an embodiment, a protective cover for a handheld portable electronic device includes a rear housing comprising a cavity and a front cover that couples to the rear housing. The cavity includes one or more openings. The cavity receives at least a portion of the handheld portable electronic device such that the handheld portable electronic device is removable from the cavity through at least one of the openings. The rear housing and the front cover include one or more studded surfaces that couple with standard building elements of a play building set.

In an embodiment, a protective cover for a tablet computer includes a rear housing, and a front cover that couples to the rear housing. The rear housing houses a portion of the tablet computer. The tablet computer is removable from the rear housing. The front cover includes a studded surface that couple with standard building elements of a play building set. The studded surface covers at least a portion of a display of the portable electronic device when the front cover is closed.

BRIEF DESCRIPTION OF THE DRAWINGS

FIG. 6 illustrates one embodiment of an adjustable stand for a portable electronic device including a case with a studded surface and a linkage.

FIG. 7 illustrates one embodiment of an adjustable stand for a portable electronic device including a case with a studded surface and adjustable strut.

FIG. 8 illustrates one embodiment of vertically-mounted holder for a portable electronic device including a case with a studded surface.

FIG. 12 illustrates one embodiment of a system including a two-piece case for a portable electronic device having studs to which building elements can be attached.

FIG. 13 illustrates a portable electronic device removed from a two-piece case.

Figure 1:
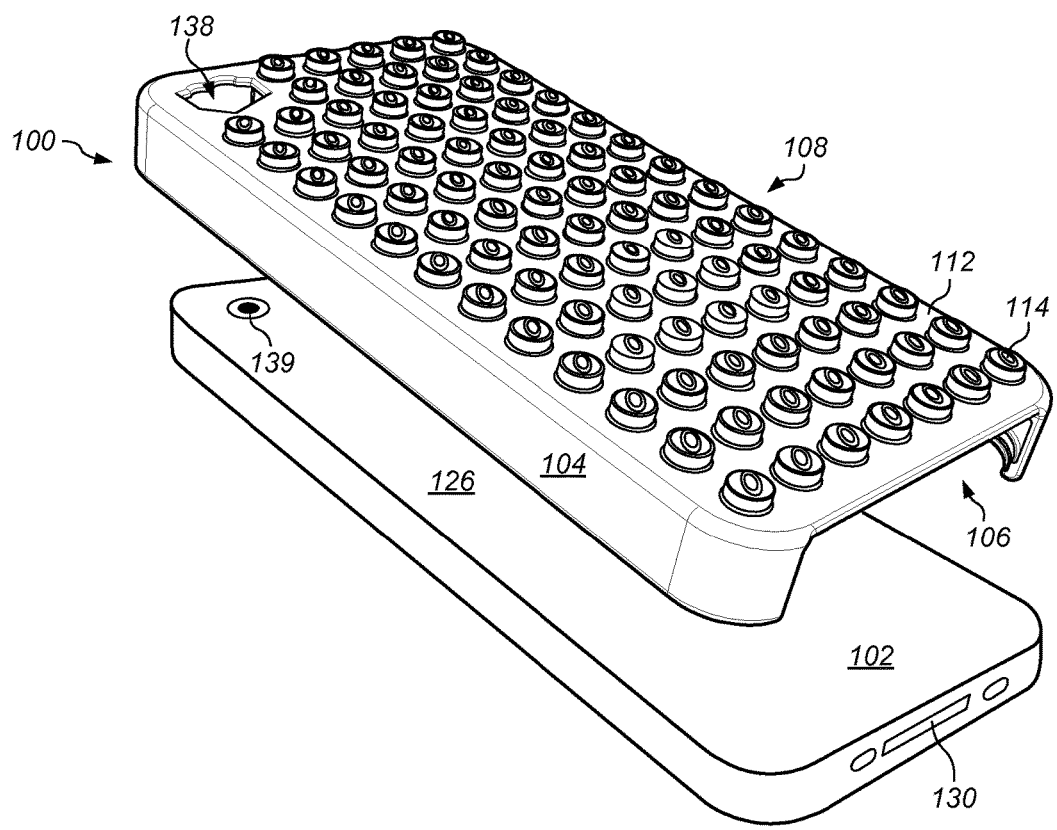
FIG. 1 illustrates one embodiment of a system including a portable electronic device and a case having studs to which building elements can be attached.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

As used herein, "building element" means an element that can be combined with one or more other elements to form a structure. Structures made from building elements may include play structures (for example, a house made of bricks), toys, sculptures, and functional structures (such as a stand, base, cover, or linkage). Examples of building elements include bricks, plates, wheels, figurines, rods, tubes, sleeves, connectors, or hinges.

As used herein, "portable electronic device" means any electronic device that is not attached to a structure at a fixed location and that can be operated, at least for some period of time, without a physical connection to a fixed power source. Examples of portable electronic devices include mobile phones, portable media players, notebook computers, computer tablets, wireless devices, and personal digital assistants (PDAs).

As used herein, "press fit" includes any coupling in which elements couple when one or more contacting portions of the elements are pushed together. In some embodiments, a press fit includes a friction fit, in which two parts are held together at least in part by friction between the mating surfaces. In some embodiments, a press fit includes an interference fit, in which the coupled elements interference with one another (for example, a shaft that is slightly larger than a hole into which it is inserted). In some embodiments, a press fit may include resilient engagement (for example, a pin inserted into a hole in an elastomeric sleeve whose inner diameter is less than the diameter of the pin.

As used herein, "sculpture" means a three-dimensional creation, work of art, or construction.

As used herein, "socket" includes any cavity, pocket, hollow, or indentation on a part that can receive or accommodate a projecting element of another part, such as a stud. In some embodiments, the walls of a socket are formed within physical tolerances such that two parts are physically coupled when one or more studs on one of the parts is installed in a corresponding socket in the other part.

As used herein, "socket surface" means a surface of an element that includes one or more sockets. A socket surface on one element may include an array of sockets that receives a corresponding array of studs on another element.

As used herein, "stud" includes any projection on a surface of an element. A stud may include a bump, a protuberance, a boss, or a pin. A stud may have any suitable shape, including round, square, rectangular, trapezoidal, or oval. In some embodiments, a stud may be formed within physical tolerances that allow one or more studs on a surface to be coupled to another element.

As used herein, "studded surface" means a surface of an element that includes one or more studs.

In some embodiments, a case for a portable electronic device includes one or more surfaces for attaching building elements to the case. The portable electronic device may be removable from the case. FIG. 1 illustrates one embodiment of a system including a portable electronic device and a case having studs to which building elements can be attached. System 100 includes portable electronic device 102 and case 104. The electronic device may be, for example, a smart phone such as an iPhone® mobile digital device, produced by Apple Inc. Portable electronic device 102 is removable from case 104.

Case 104 includes cavity 106 and rear studded surface 108. Cavity 106 receives portable electronic device 102. In some embodiments, portable electronic device 102 snaps into cavity 106.

Rear studded surface 108 includes base plate 112 and studs 114. Studs 114 may be arranged in a pattern that includes a series of rows across the surface of base plate 112. Studs 114 may serve as attachment points for building elements.

Figure 2:
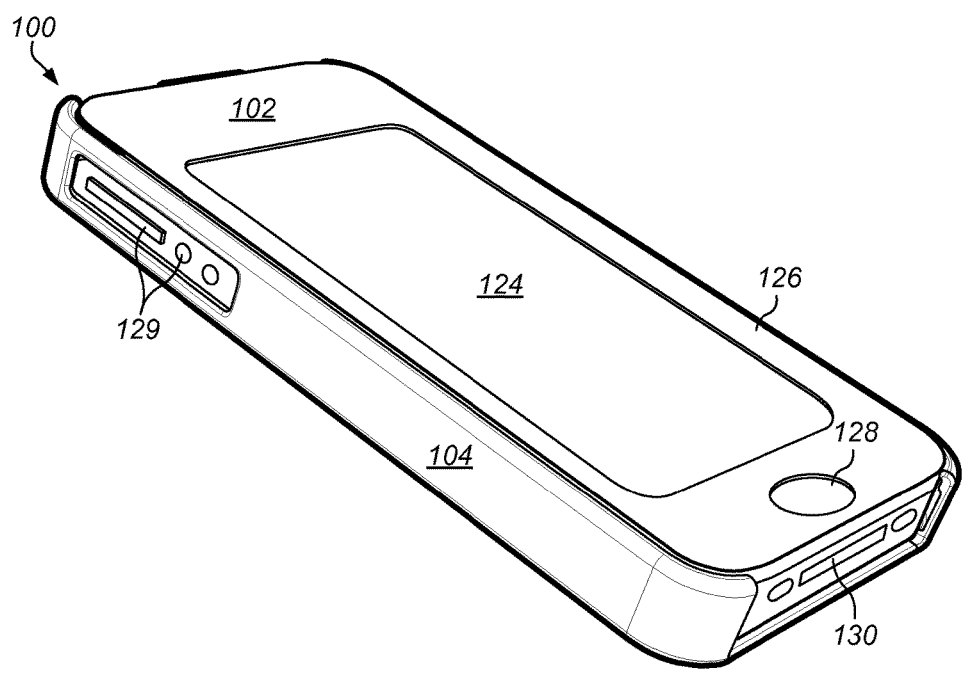
FIG. 2 illustrates an embodiment of a portable electronic device installed in a case having studded surfaces.

FIG. 2 illustrates an embodiment of a portable electronic device installed in a case having studded surfaces. Portable electronic device 102 includes front display screen 124, housing 126, home button 128, side controls 129, and connector 130. Portable electronic device 102 is seated in cavity 106 of case 104. Studded rear surface 108 (shown in FIG. 1) is opposite front display screen 124. Studded rear surface 108 may be in plane that is parallel to front display screen 124. Studded surfaces may be, in various embodiments, at other angles relative to front display screen (for example, perpendicular such as with top studded surface 170 shown in FIG. 4, or at another angle such as with studded surface 268 shown in FIG. 9).

Figure 3:
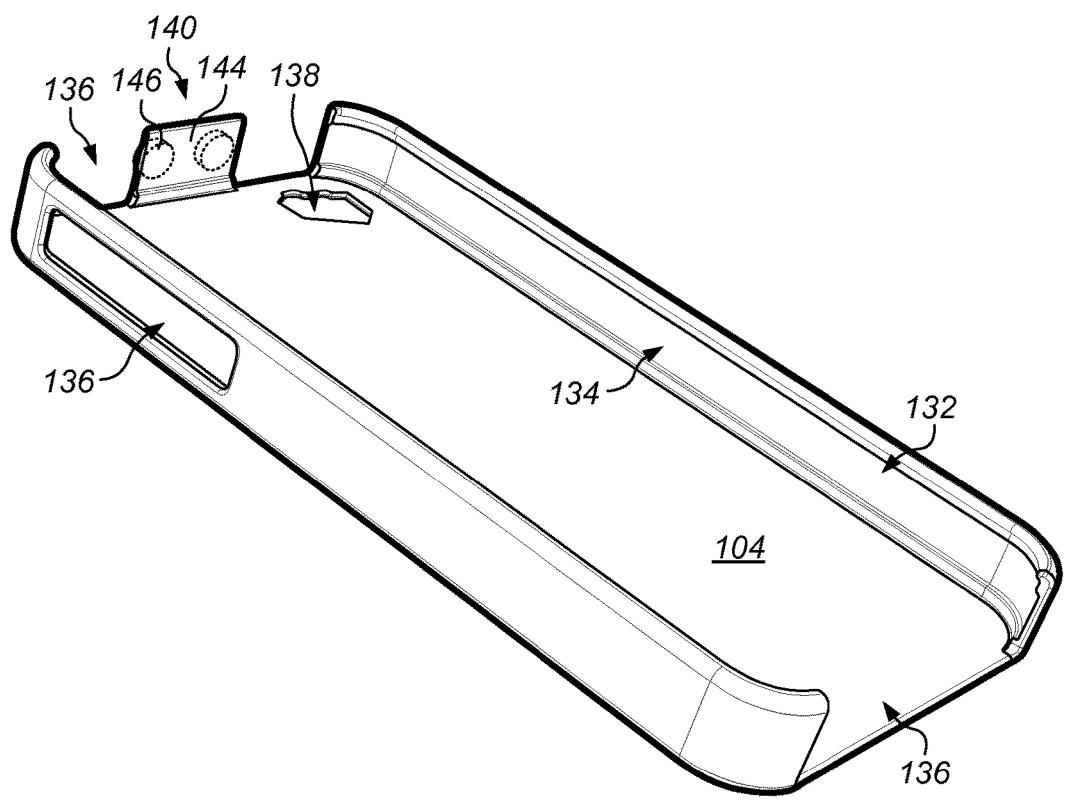
FIG. 3 illustrates the interior of one embodiment of a case for a portable electronic device.

FIG. 3 illustrates the interior of one embodiment of a case for a portable electronic device. Cavity 106 includes opening 132 and grooves 134. Opening 132 may allow portable electronic device 102 to be installed and removed from case 104. Grooves 134 may receive a portion of the edges of a portable electronic device to retain the device in case 104.

Case 104 includes cutouts 136. Cutouts 136 may be located to correspond to various elements of a particular type of a portable electronic device, such as connectors or control buttons. Opening 138 is provided for camera lens 139 of portable electronic device 102.

Top studded surface 140 is located on the upper rim of case 104. Top studded surface 140 includes base plate 144 and studs 146. Studs 146 may serve as attachment points for building elements.

Cases as described herein, such as case 104, may be made from any suitable material. In some embodiments, case 104 is injected molded. In some embodiments, a case is made of an acrylonitrile butadiene styrene ("ABS") copolymer. In one embodiment, the case is made of high flow-grade ABS, such as PA-737 POLYLAC® high flow ABS or PA-758 ABS, both produced by Chi Mei Corporation. In another embodiment, a case is made using a polycarbonate material, such as PC Makrolon 2407 produced by Bayer.

In certain embodiments, one or more of the edges of a case may be flexible. In some embodiments, the edges of a case may resiliently engage with the sides of a portable electronic device.

In some embodiments, building elements can be coupled to studs on a studded surface of a case by way of a press fit. The connection between the studded surfaces and the building elements may be, for example, based on a clamping effect such as described in U.S. Pat. No. 3,005,282, "Toy Building Brick", to G. K. Christiansen, which hereby is incorporated by reference as if fully set forth herein.

In some embodiments, tolerances on the size, shape, and spacing of studs on a case are controlled within specified tolerances such that standard blocks available from one or more building block manufacturers can be attached to the studs. In one embodiment, the studded surfaces allow for the attachment of LEGO® building elements, produced by LEGO Group. In one embodiment, each of studs 114 and studs 146 on studded surfaces 110 are 4.856 millimeters in diameter and 1.869 millimeters in height. In one embodiment, the distance between centers of adjacent studs 114 and between centers of adjacent studs 146 is 7.992 millimeters. In some embodiments, size and position tolerances are within +0.015/−0.015 millimeters.

Figure 5:
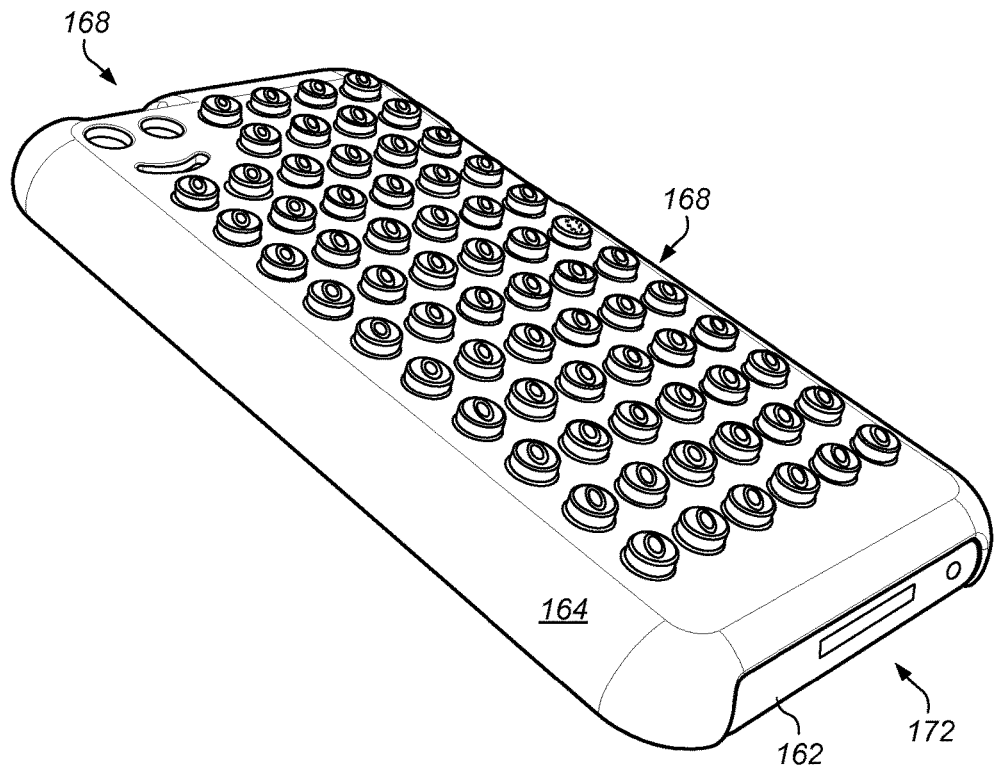
FIG. 5 is a rear perspective view illustrating one embodiment of a portable media player installed in a case having studded surfaces.
Figure 4:
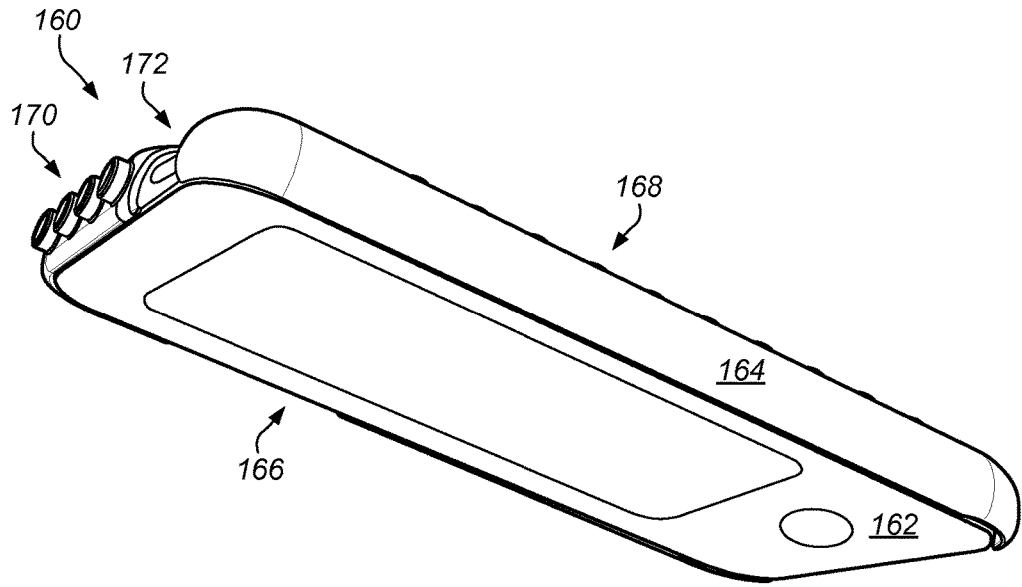
FIG. 4 is a front perspective view illustrating one embodiment of a portable media player installed in a case having studded surfaces.

In some embodiments, a case for a portable media player allows attachment of building elements at one or more surfaces of the case. FIG. 4 is a front perspective view illustrating one embodiment of a portable media player installed in a case having studded surfaces for attaching building elements. FIG. 5 is a rear perspective view illustrating one embodiment of a portable media player installed in a case having studded surfaces. System 160 includes portable media player 162 and case 164. Portable media player 162 may be, for example, a media player such as an iPod Touch® portable digital device, produced by Apple Inc. Case 164 includes cavity 166, rear studded surface 168, top studded surface 170, and cutouts 172.

In some embodiments, building elements are coupled to a case for a portable electronic device to create a holder for the portable electronic device. The holder may provide for placement or positioning of the device relative to a fixed external structure, such as a table, shelf, wall, or cabinet door. In some embodiments, a holder allows a user to adjust the position of the portable electronic device relative to a fixed external structure (for example, reorienting a display screen for the portable electronic device). In certain embodiments, the holder may accommodate, or provide routing for, cables connected to the portable electronic device.

In some embodiments, building elements attached to a case are arranged to provide a base for placement of a portable electronic device on a horizontal surface, such as a table top. FIG. 6 illustrates one embodiment of an adjustable stand for a portable electronic device including a case with a studded surface and a linkage. System 200 includes case 202, base 204, and linkage 206. In one embodiment, case 202 is similar to case 104 shown in FIG. 1. Linkage 206 includes rods 208, hinge coupler 210, hinge block 212, hinge block 214, and stop block 216. Hinge block 212 is coupled to studs on studded surface 218 of case 202. Hinge block 214 is coupled to studs on base 204. Hinge block 212, hinge block 214, and hinge coupler 210 may allow linkage to be adjusted to change the angle of case 204 relative to a horizontal surface supporting base 204.

FIG. 7 illustrates one embodiment of an adjustable stand for a portable electronic device including a case with a studded surface and adjustable strut. System 220 includes case 222, base 224, strut 226, hinge block 228, and stop block 230. In one embodiment, case 222 is similar to case 104 shown in FIG. 1. Strut 226 may be pivotally connected to base 224 by way of hinge block 228. Strut 226 may engage under a row of studs on studded surface 232. If the user desires to change the angle of a display screen in case 222 relative to base 224, strut 226 may be rotated on hinge block 228 such that the distal end of strut 226 engages a higher or lower row of studs on studded surface 232.

In some embodiments, building elements attached to a case are arranged to provide for holding a portable electronic device on a vertical surface, such as a wall. FIG. 8 illustrates one embodiment of vertically-mounted holder for a portable electronic device including a case having a studded surface. System 240 includes case 242 and wall mount 244. In one embodiment, case 242 is similar to case 104 shown in FIG. 1. Wall mount 244 may be attached to wall 246 with pad 248. Pad 248 may be, for example, a double-sided self-adhesive pad. Case 242 may be coupled to wall mount 244 by way of a press fit between studs on studded surface 250 and corresponding socket surface on wall mount 244. In the embodiment shown in FIG. 8, wall mount 244 holds a portable electronic device at an upward tilt relative to wall 246. In some embodiments, however, wall mount may hold a device such that the display screen is parallel to the wall, or tilted downward relative to the wall. The system may hold a case at any angle relative to wall. In some embodiments, the angle of a case relative to the wall may be adjustable.

Figure 9:
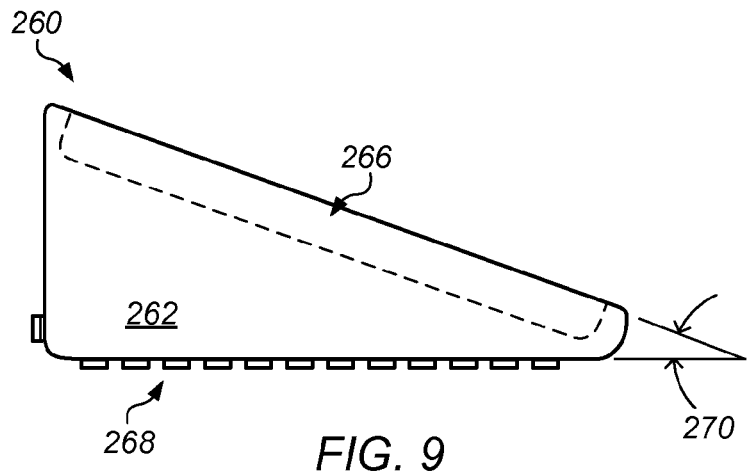
FIG. 9 illustrates one embodiment of a wedge-shaped portable electronic device case having a studded rear surface.

In some embodiments, a case for a portable electronic device includes a studded surface that is at an angle relative to the display screen of the portable electronic device. FIG. 9 illustrates one embodiment of a wedge-shaped portable electronic device case having a studded rear surface. Case 260 includes body 262, cavity 266, and studded surface 268. Studded surface 268 may be opposite the display screen of a portable electronic device installed in cavity 266. Body 262 may be in the form of a wedge such that the display screen is at an angle relative to the surface on which case 260 is resting. For example, in one embodiment, angle 270 shown in FIG. 9 is about 25 degrees.

Figure 10:
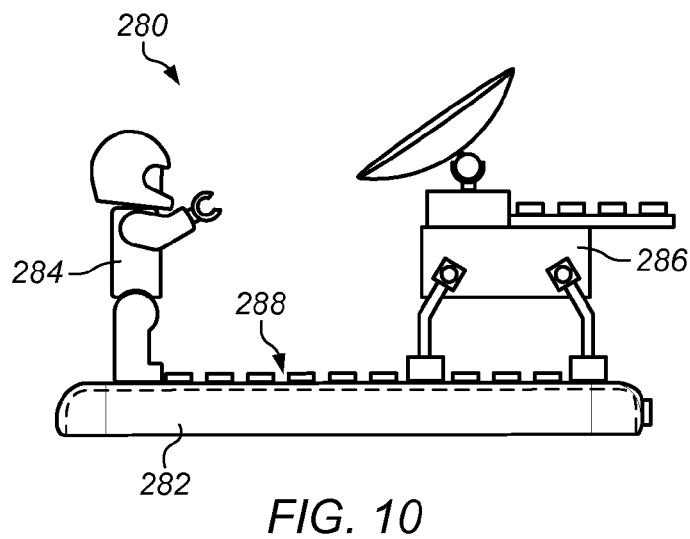
FIG. 10 illustrates one embodiment of a sculpture created on a case for a portable electronic device.

In some embodiments, a case for a portable electronic device can be used as a base surface for creating sculptures from building elements. FIG. 10 illustrates one embodiment of a sculpture created on a case for a portable electronic device. Sculpture 280 is assembled on case 282. In one embodiment, case 282 is similar to case 104 shown in FIG. 1. Elements of sculpture 280 include figurine 284 and probe model 286. Figurine 284 and probe model 286 are coupled to the top of case 282 by way of studs on studded surface 288.

Figure 11:
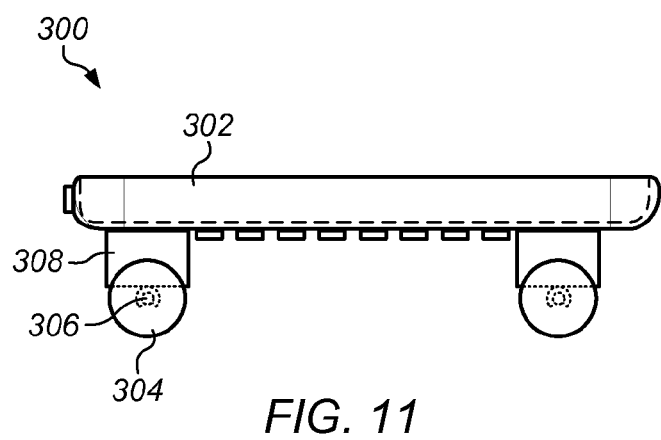
FIG. 11 illustrates an embodiment of a case to which wheels have been attached.

FIG. 11 illustrates an embodiment of a case to which wheels have been attached. System 300 includes case 302 and wheels 304. Wheels 304 roll on axles 306. Axles 306 are attached to case 302 by way of axle mounting blocks 308. System 300 may have any number of wheels.

In some embodiments, a case for an electronic device, such as a tablet computer, includes a front cover with studded surfaces and a back cover. The front cover may be hinged to the back cover (for example, along one side of the case). The electronic device may nest in a cavity of the back cover. The studded surfaces on the front cover can be coupled with building elements (for example, play bricks). In some cases, the back cover includes studded surfaces for attaching building elements.

FIG. 12 illustrates one embodiment of a system including a two-piece case for a portable electronic device having studs to which building elements can be attached. System 400 includes portable electronic device 402 and case 404. In one embodiment, the portable electronic device 402 is an iPad® tablet computer, produced by Apple Inc. In another embodiment, portable electronic device 402 is an iPad® mini tablet computer, produced by Apple Inc. Case 404 includes rear housing 406, front cover 408, and hinges 410. Front cover 408 is coupled to rear housing 410 by way of hinges 410.

Although two hinges are shown in FIG. 12 for illustrative purposes, parts of a case for an electronic device may be connected by any number of hinges. In one embodiment, a front cover is connected to the rear housing for a case by way of a single hinge. In certain embodiments, the front and rear portions of a case are fabricated from a single piece of material. In some embodiments, a hinge is located on along edges other than the left edge. For example, a hinge may be located along the top edge of the case so that the user can flip the cover up or down to access the display of the portable electronic device.

In the embodiment shown in FIG. 12, the front cover and rear housing are connected by way of hinges. In various embodiments, however, parts of a case may be connected using other types of connections. For example, a front cover may be connected to a rear housing by way of a clip, pins, or a hook and loop connection. In some embodiments, a front cover snaps into a clip onto the rear housing.

Portable electronic device 402 may be removable from case 404. FIG. 13 illustrates a portable electronic device removed from a two-piece case. Rear housing 406 includes cavity 414. Cavity 414 receives portable electronic device 402. In some embodiments, portable electronic device 402 snaps into cavity 414.

Front cover 408 includes front studded surface 420 and rim 422. Top studded surface 420 includes front base plate 424 and studs 426. Studs 426 may serve as attachment points for building elements. Studded surface 420 may be similar to studded surfaces 108 and 168 described above relative to FIGS. 1-4. Studded surfaces 422 cover the display of the electronic device when the front cover is closed.

In some embodiments, each of front cover 408 and rear housing 410 is made as a single integrated piece. In other embodiments, a case may include a cover or housing made of multiple parts. For example, a case may include a front cover having an upper half and a lower half, or a left half and a right half. Each of the halves may fold down together to cover the front of the portable electronic device.

In FIGS. 12 and 13, the front cover is shown as a solid cover. A cover of a case may nevertheless in some embodiments only partially cover the portable electronic device. For example, a cover may include perforations, holes, or cut-outs. In one embodiment, a cover for a portable electronic case is in the form of a grid.

A housing of a case for a portable electronic device may only house or cover part of the portable electronic device. For example, the housing for a portable electronic device may have openings on the rear of the housing. In some embodiments, a front cover is attached to the portable electronic device by way of a frame, clip, or slotted track. In certain embodiments, a front cover clips directly to a portable electronic device.

Figure 14:
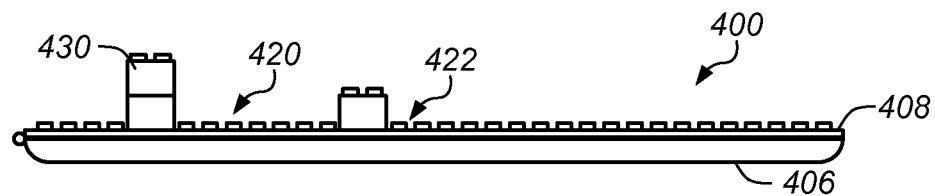
FIG. 14 is an end view of a case with play blocks installed on a front cover of the case.

In some embodiments, tolerances on the size, shape, and spacing of studs on a protective cover (for example, a case) are controlled within specified tolerances such that standard blocks available from one or more building block manufacturers can be attached to the studs. Studded surface 420 may be sufficiently stiff that standard building elements (for example, play bricks) remain attached to studded surface 420 when system 400 is moved from place to place (for example, carried from one place to another by a user). FIG. 14 illustrates an end view of a case with play blocks installed on a front cover of the case. Building elements 430 are attached to studded surface 420.

Figure 15:
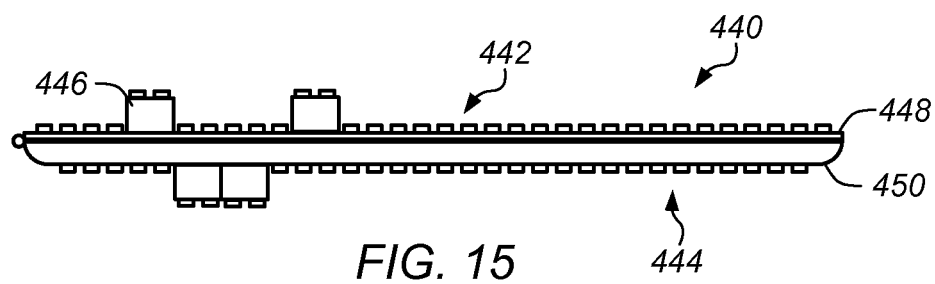
FIG. 15 illustrates one embodiment of a case having front and rear studded surfaces.

In some embodiments, a case includes studded surfaces on a both front and back of a case. FIG. 15 illustrates one embodiment of a case having front and rear studded surfaces. Case 440 includes front cover 442 and back housing 444. Play blocks may be mounted on the front cover, back housing, or both. Building elements 446 are attached to front studded surface 448 and rear studded surface 450.

In some embodiments, a front cover or rear housing, or other portion of a case includes cutouts. The cutouts may be located to correspond to various elements of a particular type of a portable electronic device, such as connectors or control buttons. In some embodiments, an opening is provided for camera lens of a portable electronic device.

Figure 16:
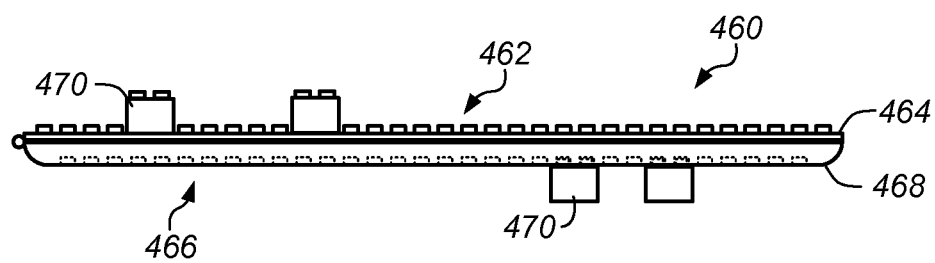
FIG. 16 illustrates one embodiment of a case including a socket surface on the underside of the case.

In some embodiments, a protective cover (for example, a case) for an electronic device includes a socket surface. The socket surface may receive studs or other elements to allow the elements to be attached to the cover. FIG. 16 illustrates one embodiment of a case including a socket surface on the underside of the case. Case 460 includes studded surface 462 on front cover 464 and socket surface 466 on rear housing 468. Building elements 470 may be attached to case 460 on studded surface 462 and socket surface 466.

Figure 17:
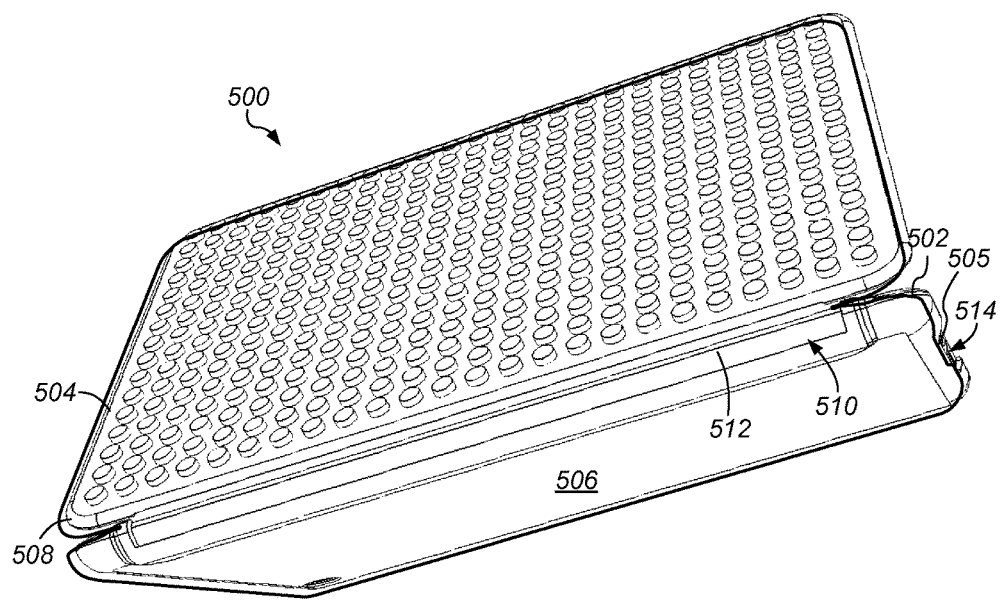
FIG. 17 is a perspective view illustrating an embodiment of a two-piece case with a hinged cover plate and housing that form a hinged connection for the cover plate.
Figure 18:
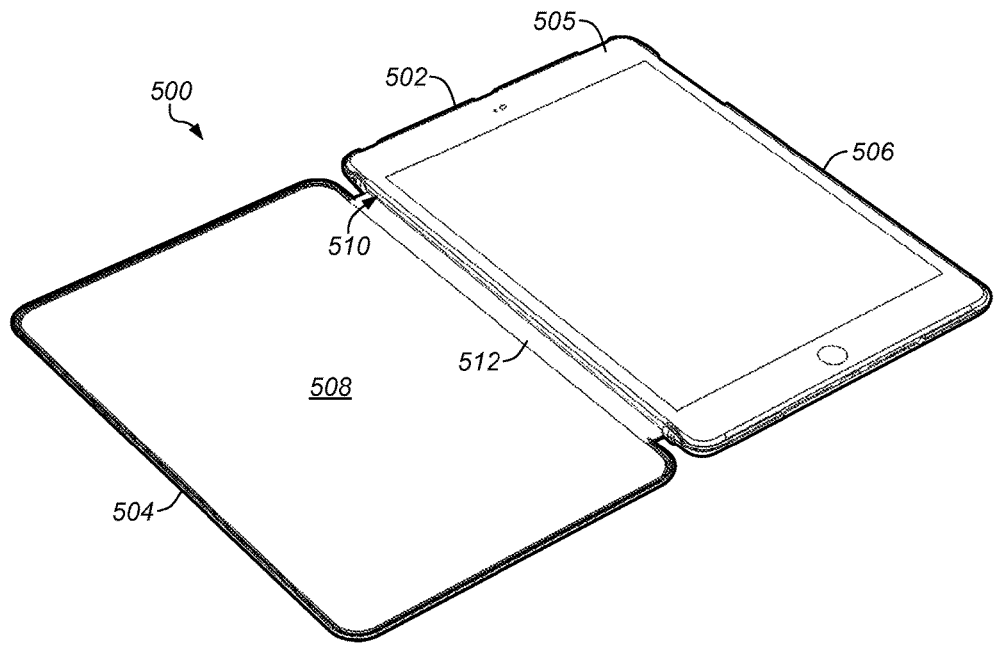
FIG. 18 is a perspective view of a portable electronic device in a case with a front cover open.

In some embodiments, the cover plate and mounting element for a cover include complementary portions that couple to form a hinge for the cover plate. FIG. 17 is a perspective view illustrating an embodiment of a case with a hinged cover plate and housing that form a hinged connection for the cover plate. FIG. 18 is a perspective view of a portable electronic device in a case with the cover open. Case 500 includes case assembly 502 and studded cover plate 504 for portable electronic device 505. Case assembly 502 includes rear housing 506 and cover plate base 508. Rear housing 506 includes hinge socket 510. Cover plate base 508 includes hinge member 512. Hinge member 512 of cover plate base 508 may couple in hinge socket 510 of rear housing 506. Case 500 may include cutouts 514 to enable access or use of elements of the portable electronic device.

Figure 19:
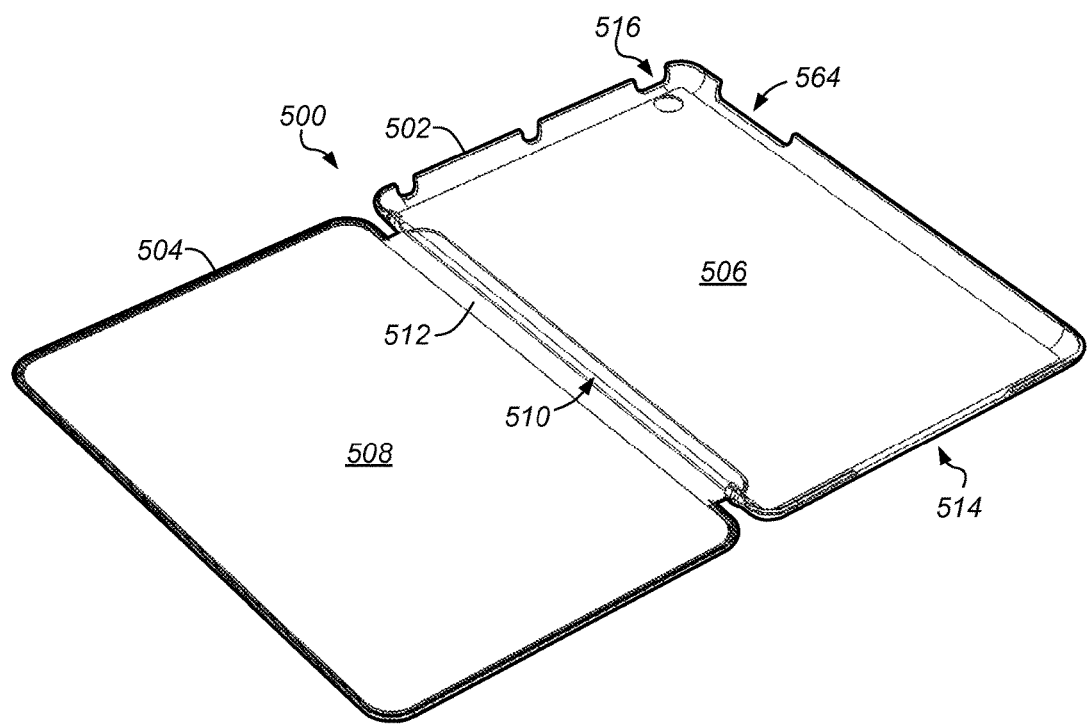
FIG. 19 illustrates one embodiment of a hinged case for a portable electronic device in an open condition.

FIG. 19 illustrates one embodiment of a hinged case for a portable electronic device in an open condition. In some embodiments, hinge member 512 snaps into hinge socket 510. Studded cover plate 504 may be swung away from the display screen of the portable electronic device on the hinge. Studded cover plate 504 may be attached to cover plate base 508. Case 500 includes cutouts 516, 564, and 512. Cutouts and openings may be located to provide for access or use of elements on a portable electronic device. In various embodiments, a case may include cutouts or apertures for a camera lens, flash memory, a retinal scanner, a fingerprint reader, or other sensor.

Figure 20:
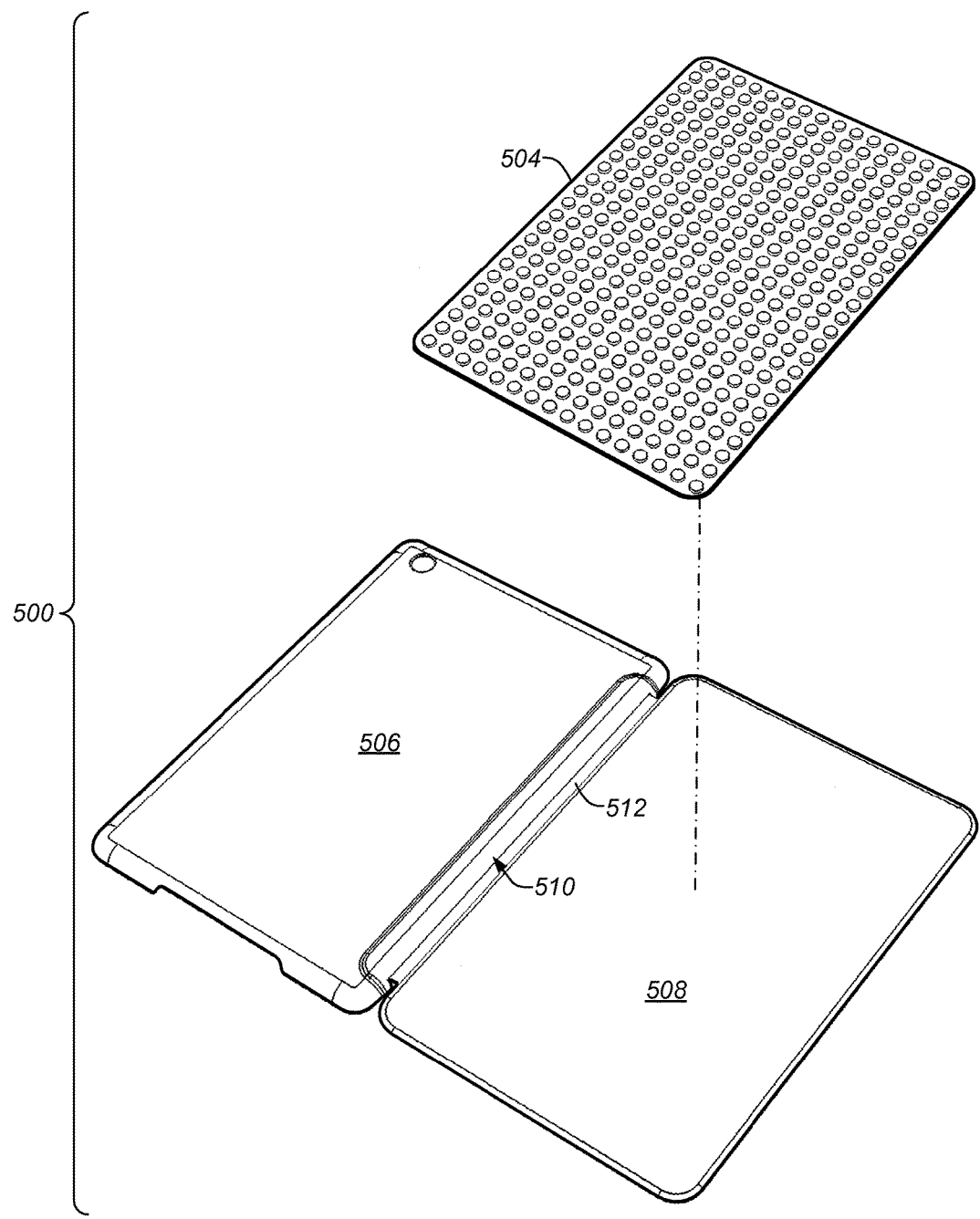
FIG. 20 is an exploded view showing studded cover plate separated from a cover plate base.

In some embodiments, a case includes studded surface members that are attached to base elements of a case. In the case shown in FIGS. 17-19, for example, studded cover plate 504 may be produced as a separate element from a housing for the case, and then attached to the housing. FIG. 20 is an exploded view showing studded cover plate 504 separated from cover plate base 508. Studded cover plate 504 may be attached to cover plate base 508 by an adhesive, snapped on, or attached by another suitable arrangement.

In some embodiments, a cover for a display of a portable electronic device is attached to a portable electronic device without a housing for the portable electronic device. In one embodiment, a one-piece cover is attached to a portable electronic device by way of magnets, adhesive, or case modifications suitable for securing the cover in place. Adhesive-backed studs are placed on one edge, which may then be connected to the cover using a flexible material or additional studded elements.

In some embodiments, a cover system for a portable electronic device includes a mount for magnetic attachment to a portable electronic device. The mount for the cover may include magnetizable materials that are attracted to magnets in the portable electronic device, such that the case is held on the portable electronic device by way of magnetic forces.

Figure 21:
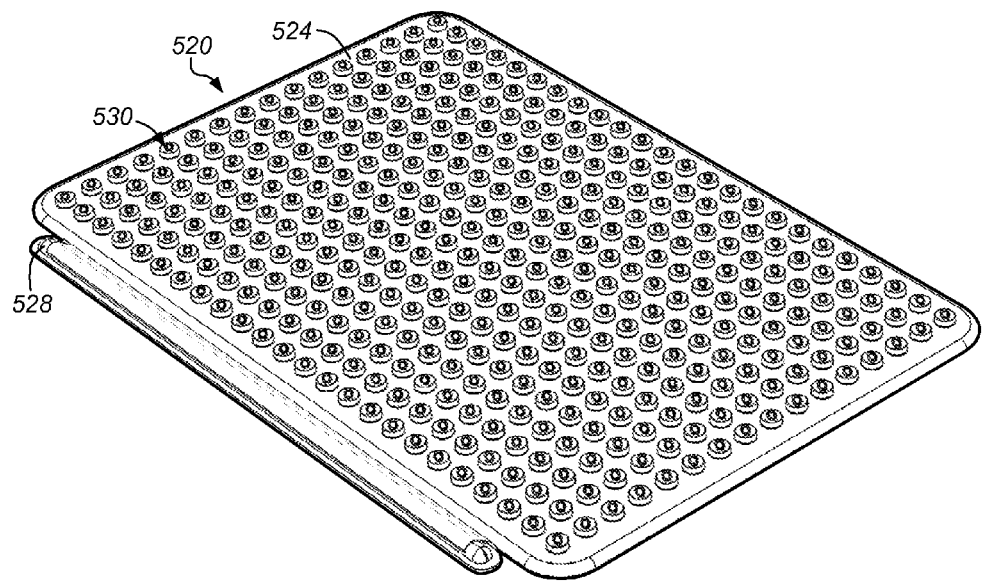
FIG. 21 illustrates one embodiment of an attachable cover system with a magnetic mounting strip.
Figure 22:
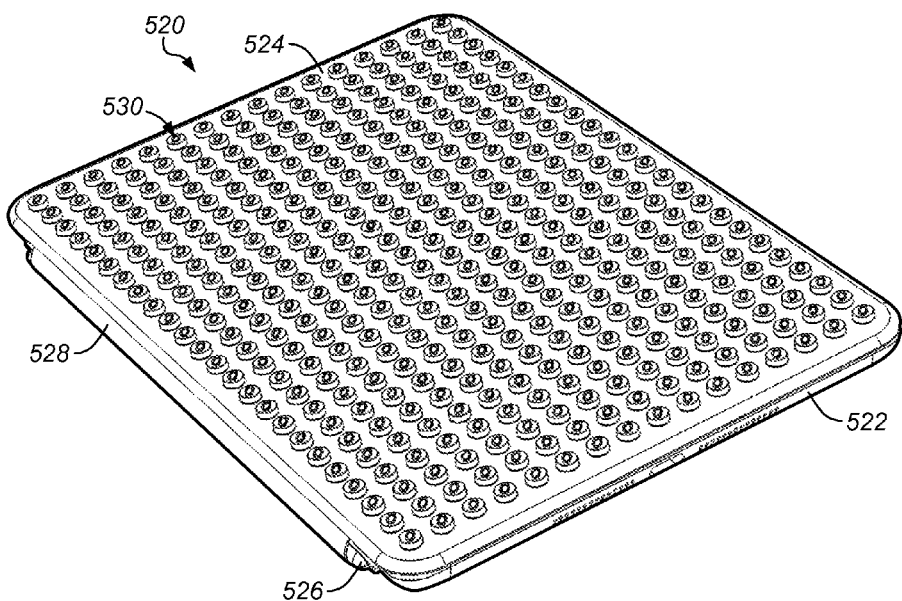
FIG. 22 illustrates the attachable cover system installed on a portable electronic device.
Figure 23:
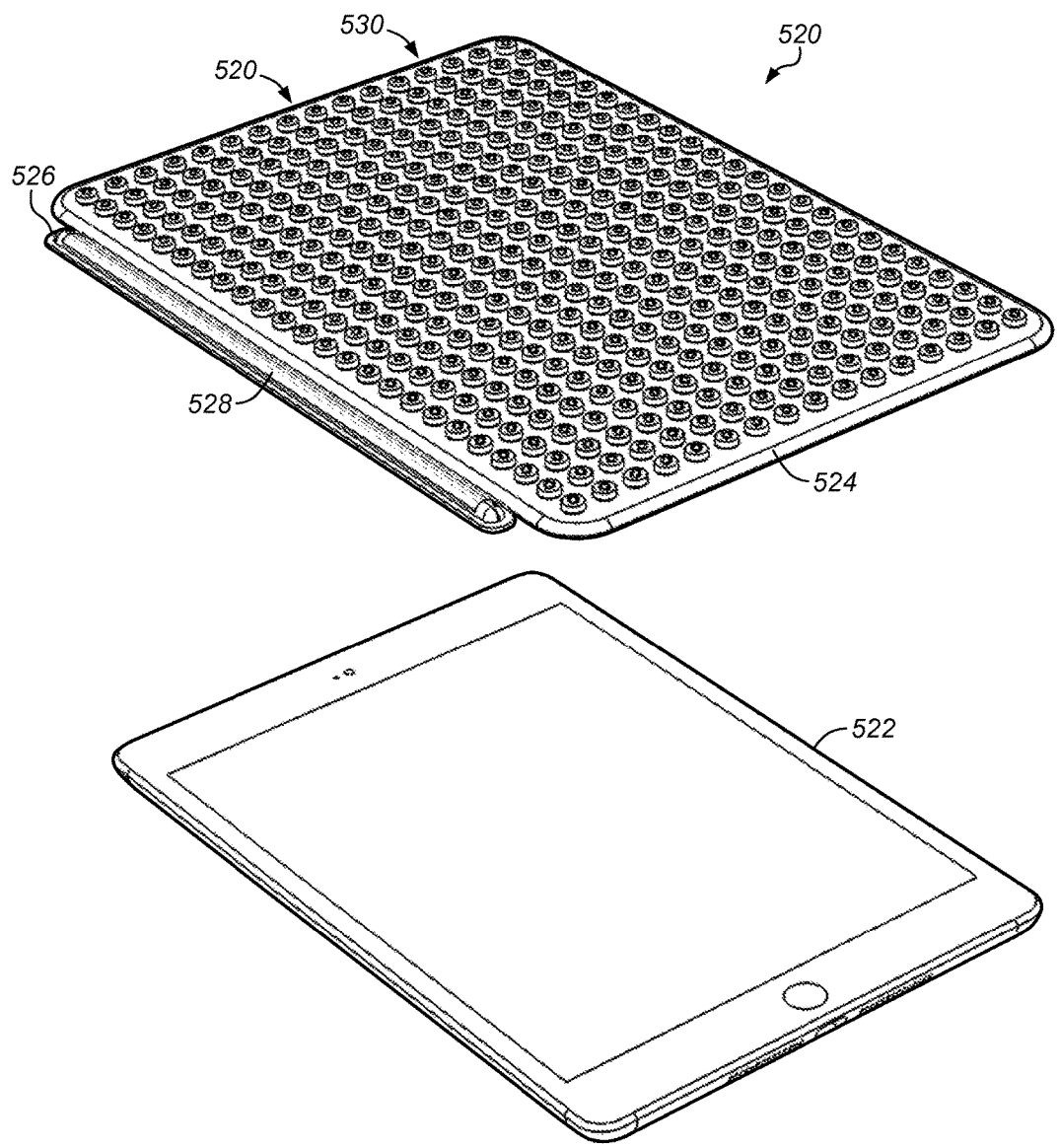
FIG. 23 is a view of the device cover assembly separated from a portable electronic device.

In some embodiments, a cover system includes a studded cover plate and a mounting strip. FIG. 21 illustrates one embodiment of an attachable cover system with a magnetic mounting strip. FIG. 22 illustrates the attachable cover system installed on a portable electronic device. FIG. 23 is a view of the device cover assembly separated from an portable electronic device. Device cover assembly 520 includes cover plate 524 and mounting strip 526. Mounting strip 526 may include magnetic elements (for example, steel pins, rods, or plugs). The magnetic elements may be attracted to magnets in portable electronic device 522. Cover plate 524 includes studded surface 530. Flexible hinge member 528 may connect cover plate 524 to mounting strip 526. Flexible hinge member 528 may be flexible (for example, made of an elastomeric material) such that cover plate 524 can be flipped away from a display screen of portable electronic device 522.

In some embodiments, a case includes protective covers for multiple displays on a portable electronic device. For example, case may include one cover plate on a front display of a portable electronic device and another cover plate on a rear display of the portable electronic device. One or more of the covers for the displays may include studded surfaces or socket surfaces. In some embodiments, the case includes in a cover or housing, which allows a part of the display to be visible to a user. In some embodiments, studded surfaces are included in a band or margin around a window for a display in a cover plate.

In the embodiments shown above, surfaces of cases include studs that can serve as attachment points for building elements. A case for a portable electronic device may, however, include in various embodiments other elements or structures for attaching building elements. Examples of such elements and structures include sockets, loops, tabs, hooks, and ridges.

In the embodiment shown in FIGS. 1 and 12, studs are evenly spaced in two dimensions (for example, along an "x-axis" and a "y-axis") across the surface of the case. Attachment elements may, however, be arranged in various embodiments with any spacing between elements. Other patterns may include, in various embodiments, a circular pattern, and radiating pattern, or a random pattern. In some embodiments, for example, the spacing between rows of studs in one direction is different from the spacing of rows in another direction.

Although in various embodiments described above, a case included studs that can be received in corresponding receptacles on building elements, the elements may in various embodiments be reversed. Thus, for example in certain embodiments a case may have receptacles for receiving studs on building elements instead of, or in addition to, having studs on the case.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Methods may be implemented manually, in software, in hardware, or a combination thereof. The order of any method may be changed, and various elements may be added, reordered, combined, omitted, modified, etc. Changes may be made in the elements described herein without departing from the spirit and scope of the invention as described in the following claims.

What is claimed is:

1. A protective cover for a handheld portable electronic device, comprising:
    a front cover configurable to cover and protect at least a portion of a display screen of the handheld portable electronic device,
    wherein the front cover comprises:
        a plate portion; and
        a hinge member extending at least partially laterally and at least partially rearwardly from the plate portion;
    one or more mounting portions coupled to the front cover, wherein at least one of the mounting portions is configured to couple the front cover to the handheld portable electronic device,
    wherein at least one of the mounting portions comprises a rear housing wherein the rear housing comprises:
        a cavity comprising a front opening, wherein the cavity is configured to receive at least a portion of the handheld portable electronic device such that the handheld portable electronic device is removable from the cavity through the front opening; and
        a hinge socket on a lateral edge of the rear housing, wherein the hinge socket comprises a pair of opposing engaging portions and an elongated open slot between the opposing engaging portions;
    wherein, when the front cover is in place over the display screen, at least a portion of the front cover covering the display screen comprises one or more studded surfaces or one or more socket surfaces, wherein at least one of the studded surfaces or socket surfaces on the portion of the front cover covering the display screen is configured to receive standard building elements of a play building set such that a user can add building elements over the display screen when the front cover is closed over the display screen,
    wherein the elongated open slot of the hinge socket is in one side of the cavity of the rear housing at a lateral edge of the rear housing, and wherein the elongated open slot adjoins the front opening of the cavity,
    wherein the front cover is coupled to the rear housing by way of a snap-in connection of the hinge member of the front cover with the opposing engaging portions in the elongated open slot in the side of the cavity in the rear housing along the side of the handheld portable electronic device, and
    wherein the hinge member of the front cover is engaged in the elongated open slot between the opposing engaging portions of the hinge socket of the rear housing such that at least one of the studded surfaces or socket surfaces on the portion of the front cover covering the display screen can be swung away to one side of the display screen by way of the snap-in connection at the lateral edge of the rear housing.

2. The protective cover of claim 1, wherein the front cover comprises at least one studded surface.

3. The protective cover of claim 1, wherein the rear housing comprises a socket surface.

4. The protective cover of claim 1, wherein the front cover comprises at least one of the studded surfaces or at least one of the socket surfaces.

5. The protective cover of claim 1, wherein the mounting portions comprises at least one of the studded surfaces.

6. The protective cover of claim 1, wherein at least one of the mounting portions is configured to couple to the handheld portable electronic device by way of a magnetic attachment.

7. The protective cover of claim 1, the handheld portable electronic device is a tablet computer.

8. The protective cover of claim 1, wherein at least one of the studded surfaces or socket surfaces is on a side of the case that is opposite to a display screen of the handheld portable electronic device when the handheld portable electronic device is installed in the cavity.

9. The protective cover of claim 1, wherein the building elements are configured to couple to at least one of the studded surfaces or socket surfaces by way of a press fit.

10. The protective cover of claim 1, wherein at least a portion of the case comprises a flexible material configured to resiliently couple with the handheld portable electronic device.

11. The protective cover of claim 1, further comprising at least one opening for a camera lens or a sensor in the handheld portable electronic device.

12. A protective cover for a handheld portable electronic device, comprising:
- a front cover comprising one or more studded surfaces or socket surfaces, wherein the front cover is configurable to be swung into place to cover and protect at least a portion of a display screen of the handheld portable electronic device,
- wherein the front cover comprises:
  - a plate portion; and
  - a hinge member extending at least partially laterally and at least partially rearwardly from the plate portion; and
- one or more mounting portions coupled to the front cover, wherein at least one of the mounting portions is configured to couple the front cover to the handheld portable electronic device,
  - wherein at least one of the mounting portions comprises a rear housing wherein the rear housing comprises:
    - a cavity comprising a front opening, wherein the cavity is configured to receive at least a portion of the handheld portable electronic device such that the handheld portable electronic device is removable from the cavity through the front opening; and
  - a hinge socket on a lateral edge of the rear housing, wherein the hinge socket comprises a pair of opposing engaging portions and an elongated open slot between the opposing engaging portions,
- wherein, when the front cover is in place over the display screen, at least a portion of the front cover covering the display screen comprises one or more studded surfaces or one or more socket surfaces, wherein at least one of the studded surfaces or socket surfaces on the portion of the front cover covering the display screen is configured to receive standard building elements of a play building set such that a user can add building elements over the display screen when the front cover is closed over the display screen,
- wherein the elongated open slot of the hinge socket is in one side of the cavity of the rear housing at a lateral edge of the rear housing, and wherein the elongated open slot adjoins the front opening of the cavity,
- wherein the front cover is coupled to the rear housing by way of a snap-in connection of the hinge member of the front cover with the opposing engaging portions in the elongated open slot in the side of the cavity in the rear housing along the side of the handheld portable electronic device, and
- wherein the hinge member of the front cover is engaged in the elongated open slot between the opposing engaging portions of the hinge socket of the rear housing such that at least one of the studded surfaces or socket surfaces on the portion of the front cover covering the display screen can be swung away to one side of the display screen by way of the snap-in connection at the lateral edge of the rear housing.

13. The protective cover of claim 12, wherein at least a portion of the protective cover comprises a flexible material configured to resiliently couple with the handheld portable electronic device.

* * * * *